(12) United States Patent
Koizumi et al.

(10) Patent No.: US 9,099,619 B2
(45) Date of Patent: Aug. 4, 2015

(54) SEMICONDUCTOR LIGHT EMITTING DEVICE AND METHOD FOR MANUFACTURING THE SAME

(75) Inventors: Hiroshi Koizumi, Kanagawa-ken (JP);
Naoaki Sakurai, Kanagawa-ken (JP);
Yoshiaki Sugizaki, Kanagawa-ken (JP);
Yasuhide Okada, Kanagawa-ken (JP);
Tomomichi Naka, Kanagawa-ken (JP);
Masahiro Uekita, Kanagawa-ken (JP);
Akihiro Kojima, Kanagawa-ken (JP);
Yosuke Akimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/419,684

(22) Filed: Mar. 14, 2012

(65) Prior Publication Data

US 2012/0235184 A1 Sep. 20, 2012

(30) Foreign Application Priority Data

Mar. 15, 2011 (JP) ................. 2011-056613

(51) Int. Cl.
*H01L 29/20* (2006.01)
*H01L 21/00* (2006.01)
*H01L 33/50* (2010.01)
*H01L 33/00* (2010.01)

(52) U.S. Cl.
CPC ............ *H01L 33/508* (2013.01); *H01L 33/505* (2013.01); *H01L 33/0079* (2013.01); *H01L 33/504* (2013.01); *H01L 2933/0016* (2013.01); *H01L 2933/0041* (2013.01)

(58) Field of Classification Search
USPC ............... 257/13, 79–103, 918, 40, 642–643, 257/759, E51.018–E51.022, E33.054, 257/E25.028, E25.032, E31.058, E31.063, 257/E31.115, E27.133–E27.139; 438/22–47, 69, 493, 503, 507, 956

See application file for complete search history.

(56) References Cited

U.S. PATENT DOCUMENTS

| | | | | |
|---|---|---|---|---|
| 2005/0139851 A1* | 6/2005 | Sato | ................................ | 257/99 |
| 2006/0274227 A1* | 12/2006 | Komoto et al. | ................. | 349/71 |
| 2008/0030976 A1* | 2/2008 | Murazaki et al. | ............... | 362/84 |

(Continued)

FOREIGN PATENT DOCUMENTS

| CN | 201209828 Y | 3/2009 |
|---|---|---|
| JP | 2001-177158 | 6/2001 |

(Continued)

OTHER PUBLICATIONS

U.S. Appl. No. 13/456,458, filed Apr. 26, 2012, Uekita, et al.

(Continued)

*Primary Examiner* — Chuong A Luu
*Assistant Examiner* — Moin Rahman
(74) *Attorney, Agent, or Firm* — Oblon, McClelland, Maier & Neustadt, L.L.P.

(57) ABSTRACT

According to one embodiment, a semiconductor light emitting device includes a light emitting section and a wavelength conversion section. The light emitting section is configured to emit light. The wavelength conversion section is provided on one major surface side of the light emitting section. The wavelength conversion section contains a phosphor. The wavelength conversion section has a distribution of amount of the phosphor based on a distribution of wavelength of the light emitted from the light emitting section.

5 Claims, 8 Drawing Sheets

(56) References Cited

U.S. PATENT DOCUMENTS

| | | | |
|---|---|---|---|
| 2008/0042153 A1* | 2/2008 | Beeson et al. | 257/94 |
| 2008/0135862 A1* | 6/2008 | Maeda et al. | 257/98 |
| 2009/0101930 A1* | 4/2009 | Li | 257/98 |
| 2010/0052006 A1* | 3/2010 | Takeda et al. | 257/100 |
| 2010/0112734 A1 | 5/2010 | Koizumi et al. | |
| 2010/0140640 A1* | 6/2010 | Shimokawa et al. | 257/98 |
| 2010/0320928 A1* | 12/2010 | Kaihotsu et al. | 315/250 |
| 2011/0204400 A1 | 8/2011 | Koizumi et al. | |
| 2011/0297987 A1 | 12/2011 | Koizumi et al. | |

FOREIGN PATENT DOCUMENTS

| | | |
|---|---|---|
| JP | 2003-46124 | 2/2003 |
| JP | 2003-46134 | 2/2003 |
| JP | 2004-221536 | 8/2004 |
| JP | 2006-86191 | 3/2006 |
| JP | 2006-210491 A | 8/2006 |
| JP | 2007-66969 | 3/2007 |
| JP | 2008-130279 | 6/2008 |
| JP | 2009-147312 A | 7/2009 |
| JP | 2009-267164 | 11/2009 |
| JP | 2010-135763 | 6/2010 |
| JP | 2011-171557 | 9/2011 |
| JP | 2011-258675 | 12/2011 |
| TW | 201000602 | 1/2010 |
| WO | WO 2009/123726 A2 | 10/2009 |
| WO | WO 2009/123726 A3 | 10/2009 |

OTHER PUBLICATIONS

Notification of Reason(s) for Refusal issued Mar. 12, 2013 in Japanese Patent Application No. 2011-056613 (with English translation).
Office Action issued Apr. 25, 2013, in Korean Patent Application No. 10-2012-26148 with English translation.
Office Action issued Jul. 16, 2013 in Japanese Application No. 2011-056613 (With English Translation).
Action issued on Mar. 4, 2014 in the counterpart Chinese Patent Application No. 201210068814.X (with English Translation).
Taiwanese Office Action issued Sep. 11, 2014, in Taiwan Patent Application No. 101107526 (with English translation).
U.S. Appl. No. 14/463,933, filed Aug. 20, 2014, Koizumi, et al.

* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2011-056613, filed on Mar. 15, 2011; the entire contents of which are incorporated herein by reference.

FIELD

Embodiments described herein relate generally to a semiconductor light emitting device and method for manufacturing the same.

BACKGROUND

A semiconductor light emitting device can be based on a semiconductor light emitting element (hereinafter simply referred to as light emitting element) and a phosphor. For instance, there is known a semiconductor light emitting device in which a light emitting element for emitting blue light (e.g., blue LED (light emitting diode)) is combined with a phosphor for emitting yellow light complementary to blue to obtain white light.

Such a semiconductor light emitting device can be manufactured by providing a light emitting element in a casing and then dropping a paste-like resin mixed with phosphor onto the light emitting element.

In this case, the phosphor is blended into the resin so that its amount accounts for a prescribed proportion (concentration). However, if the proportion of the amount of phosphor is fixed, the problem is that the variation in the wavelength of light emitted from the light emitting elements results in increasing the variation of chromaticity.

BRIEF DESCRIPTION OF THE DRAWINGS

FIGS. 7A to 8D are schematic process sectional views for illustrating a method for manufacturing a semiconductor light emitting device according to a second embodiment.

DETAILED DESCRIPTION

In general, according to one embodiment, a semiconductor light emitting device includes a light emitting section and a wavelength conversion section. The light emitting section is configured to emit light. The wavelength conversion section is provided on one major surface side of the light emitting section. The wavelength conversion section contains a phosphor. The wavelength conversion section has a distribution of amount of the phosphor based on a distribution of wavelength of the light emitted from the light emitting section.

Embodiments will now be illustrated with reference to the drawings. In the drawings, similar components are labeled with like reference numerals, and the detailed description thereof is omitted appropriately.

In the following, as an example, a semiconductor light emitting device including a plurality of light emitting sections (so-called multi-chip semiconductor light emitting device) is illustrated.

[First Embodiment]

Figure 1A:
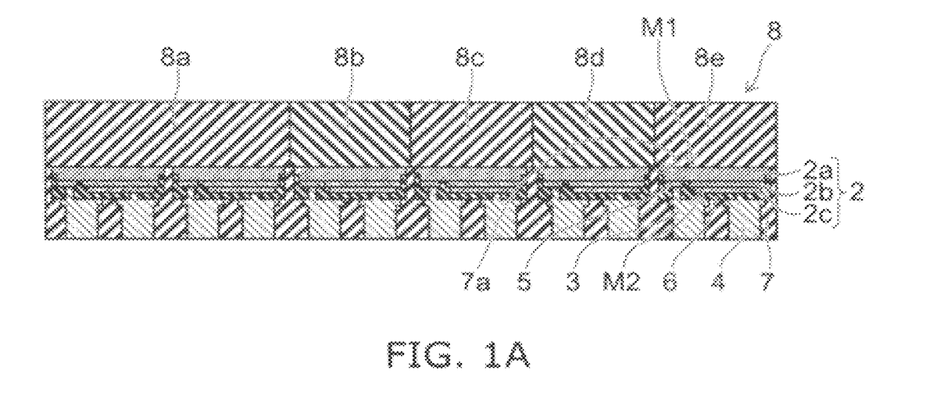
FIGS. 1A and 1B are schematic sectional views for illustrating semiconductor light emitting devices according to a first embodiment.
Figure 1B:
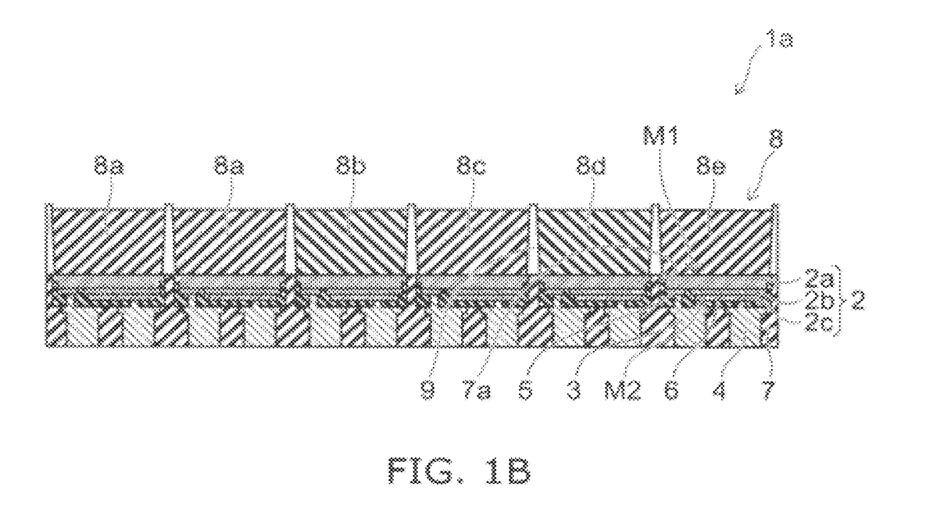

FIGS. 1A and 1B are schematic sectional views for illustrating semiconductor light emitting devices according to a first embodiment.

As shown in FIG. 1A, the semiconductor light emitting device 1 includes a light emitting section 2, an electrode section 3, an electrode section 4, a junction section 5, an insulating section 6, a sealing section 7, and a wavelength conversion section 8.

As shown in FIG. 1B, the semiconductor light emitting device 1a further includes a wall section 9 surrounding the periphery of the wavelength conversion section for each light emitting section 2.

The light emitting section 2 includes a major surface M1, and a major surface M2 opposite to the major surface M1. A plurality of light emitting sections 2 are provided.

The light emitting section 2 for emitting light includes a semiconductor section 2a, an active section 2b, and a semiconductor section 2c.

The semiconductor section 2a can be formed from an n-type nitride semiconductor. Examples of the nitride semiconductor can include GaN (gallium nitride), AlN (aluminum nitride), AlGaN (aluminum gallium nitride), and InGaN (indium gallium nitride).

The active section 2b is provided between the semiconductor section 2a and the semiconductor section 2c.

The active section 2b can be configured as a quantum well structure composed of a well layer for generating light by recombination of holes and electrons, and a barrier layer (cladding layer) having a larger band gap than the well layer.

The quantum well structure can be a single quantum well (SQW) structure or a multiple quantum well (MQW) structure. It is also possible to stack a plurality of single quantum well structures.

As an example, the quantum well structure can include a well layer formed from InGaN and a barrier layer formed from GaN.

In this case, for instance, blue light can be emitted using a multiple quantum well structure of e.g. InGaN/GaN. Ultraviolet radiation can be emitted using a multiple quantum well structure of e.g. GaN/AlGaN, InAlGaN/InAlGaN, or InGaN/AlGaN.

However, the configuration of the active section 2b is not limited to the quantum well structure. Structures capable of emitting light can be appropriately selected.

The semiconductor section 2c can be formed from a p-type nitride semiconductor. Examples of the nitride semiconductor can include GaN, AlN, AlGaN, and InGaN.

The light emitting section 2 can be e.g. a light emitting diode having a peak emission wavelength of 350-600 nm.

The electrode section 3 and the electrode section 4 are provided so as to penetrate between the bottom surface of a recess 7a and the end surface of the sealing section 7. For instance, the electrode section 3 and the electrode section 4 can be shaped like a cylindrical column and formed from a metal material such as Cu (copper).

One end portion of the electrode section 3 is electrically connected to the junction section 5. Thus, the electrode section 3 and the semiconductor section 2a are electrically connected via the junction section 5.

One end portion of the electrode section 4 is electrically connected to the semiconductor section 2c.

Furthermore, for instance, a solder bump and a protective film, not shown, can be provided so as to cover the end surface of the electrode section 3 and the electrode section 4 on the side exposed from the sealing section 7.

The shape, material and the like of the electrode section 3 and the electrode section 4 are not limited to those illustrated, but can be appropriately modified.

The junction section 5 is provided between the electrode section 3 and the semiconductor section 2a. The junction section 5 can be formed from a metal material such as Cu (copper). The junction section 5 is not necessarily needed, but can be appropriately provided as necessary.

The insulating section 6 is provided so as to fill the recess 7a provided in the sealing section 7. The insulating section 6 can be formed from an insulating material. For instance, the insulating section 6 can be formed from an inorganic material such as $SiO_2$, or a resin.

Here, in the case where the light emitted from the light emitting section 2 is ultraviolet to blue light with short wavelength and also has high brightness, the resin forming the insulating section 6 may be degraded. Thus, in the case of forming the insulating section 6 from a resin, it is preferable to use a resin resistant to degradation due to blue light and the like. Examples of the resin resistant to degradation due to blue light and the like can include methyl phenyl silicone and dimethyl silicone having a refractive index of approximately 1.5.

The sealing section 7 is provided on the major surface M2 side of the light emitting section 2. The sealing section 7 seals the electrode section 3 and the electrode section 4 while exposing the end portion of the electrode section 3 and the end portion of the electrode section 4.

The sealing section 7 can be formed from e.g. a thermosetting resin.

The sealing section 7 includes a recess 7a, and also serves to seal the light emitting section 2 and the junction section 5 provided inside the recess 7a. Here, the sealing section 7 and the insulating section 6 can be integrally formed.

The wavelength conversion section 8 is provided on the major surface M1 side of the light emitting section 2, and contains the phosphor described later. The wavelength conversion section 8 has a distribution of the amount of phosphor based on the wavelength of light emitted from the light emitting sections 2. The detail of the distribution of the amount of phosphor is described later.

The wavelength conversion section 8 can be formed from e.g. a resin mixed with a phosphor having wavelength conversion capability.

The light transmittance of the wavelength conversion section 8 can be set to e.g. 90% or more in the wavelength range of 420-720 nm.

The form of the phosphor can be e.g. particulate. In this case, at least one or more particles of the phosphor can be included.

The wavelength conversion section 8 can include at least one or more kinds of phosphor having a peak emission wavelength at 440 nm or more and 470 nm or less (blue), at 500 nm or more and 555 nm or less (green), at 560 nm or more and 580 nm or less (yellow), or at 600 nm or more and 670 nm or less (red). The wavelength conversion section 8 can include a phosphor having an emission wavelength band of 380-720 nm.

The phosphor can include at least one element selected from the group consisting of silicon (Si), aluminum (Al), titanium (Ti), germanium (Ge), phosphorus (P), boron (B), yttrium (Y), alkaline earth element, sulfide element, rare earth element, and nitride element.

Examples of the material of the phosphor emitting red fluorescence can include the following. However, the phosphor emitting red fluorescence is not limited thereto, but can be appropriately modified.

$La_2O_2S:Eu,Sm$,
$LaSi_3N_5:Eu^{2+}$,
$\alpha$-sialon:$Eu^{2+}$,
$CaAlSiN_3:Eu^{2+}$,
$(SrCa)AlSiN_3:Eu^{X+}$,
$Sr_x(Si_yAl_3)_z(O_xN):Eu^{X+}$ Examples of the material of the phosphor emitting green fluorescence can include the following. However, the phosphor emitting green fluorescence is not limited thereto, but can be appropriately modified.

$(Ba,Sr,Mg)O.aAl_2O_3:Mn$,
$(BrSr)SiO_4:Eu$,
$\alpha$-sialon:$Yb^{2+}$,
$\beta$-sialon:$Eu^{2+}$,
$(CaSr)Si_2O_4N_7:Eu^{2+}$,
$Sr(SiAl)(ON):Ce$ Examples of the material of the phosphor emitting blue fluorescence can include the following. However, the phosphor emitting blue fluorescence is not limited thereto, but can be appropriately modified.

$ZnS:Ag,Cu,Ga,Cl$,
$(Ba,Eu)MgAl_{10}O_{17}$,
$(Ba,Sr,Eu)(Mg,Mn)Al_{10}O_{17}$,
$10(Sr,Ca,Ba,Eu).6PO_4.Cl_2$,
$BaMg_2Al_{16}O_{25}:Eu$,
$Y_3(Al,Ga)_5O_{12}:Ce$,
$SrSi_2ON_{2.7}:Eu^{2+}$

Examples of the material of the phosphor emitting yellow fluorescence can include the following. However, the phosphor emitting yellow fluorescence is not limited thereto, but can be appropriately modified.

$Li(Eu,Sm)W_2O_8$,
$(Y,Gd)_3(Al,Ga)_5O_{12}:Ce^{3+}$,
$Li_2SrSiO_4:Eu^{2+}$,
$(Sr(Ca,Ba))_3SiO_5:Eu^{2+}$,
$SrSi_2ON_{2.7}:Eu^{2+}$

Examples of the material of the phosphor emitting yellow-green fluorescence can include the following. However, the phosphor emitting yellow-green fluorescence is not limited thereto, but can be appropriately modified.

$SrSi_2ON_{2.7}:Eu^{2+}$

Here, the phosphor mixed is not limited to one kind, but a plurality of kinds of phosphor may be mixed. In this case, the mixing ratio of a plurality of kinds of phosphor can be changed to change the tint, such as bluish white light and yellowish white light.

Examples of the resin mixed with the phosphor can include epoxy resin, silicone resin, methacrylic resin (PMMA), polycarbonate (PC), cyclic polyolefin (COP), alicyclic acrylate (OZ), allyldiglycol carbonate (ADC), acrylic resin, fluororesin, hybrid resin of silicone resin and epoxy resin, and urethane resin.

The refractive index of the resin mixed with the phosphor is preferably made equal to or less than the refractive index of the phosphor. The light transmittance of the resin mixed with the phosphor is preferably set to 90% or more.

Here, in the case where the light emitted from the light emitting section 2 is ultraviolet to blue light with short wavelength and also has high brightness, the resin forming the wavelength conversion section 8 may be degraded. Thus, the resin forming the wavelength conversion section 8 is preferably made resistant to degradation due to blue light and the like. Examples of the resin resistant to degradation due to blue light and the like can include methyl phenyl silicone, dimethyl silicone, and a hybrid resin of methyl phenyl silicone and epoxy resin having a refractive index of approximately 1.5.

However, the resin mixed with the phosphor is not limited to those illustrated, but can be appropriately modified.

Here, the light emitting section 2 can be formed by using e.g. the epitaxial growth method. However, in the forming process, variation may occur in the thickness dimension of the light emitting sections 2. If variation occurs in the thickness dimension of the light emitting sections 2, the wavelength of light emitted from the light emitting sections 2 is varied.

Then, the variation in the wavelength of light emitted from the light emitting sections 2 results in the variation of chromaticity as well.

Figure 2:
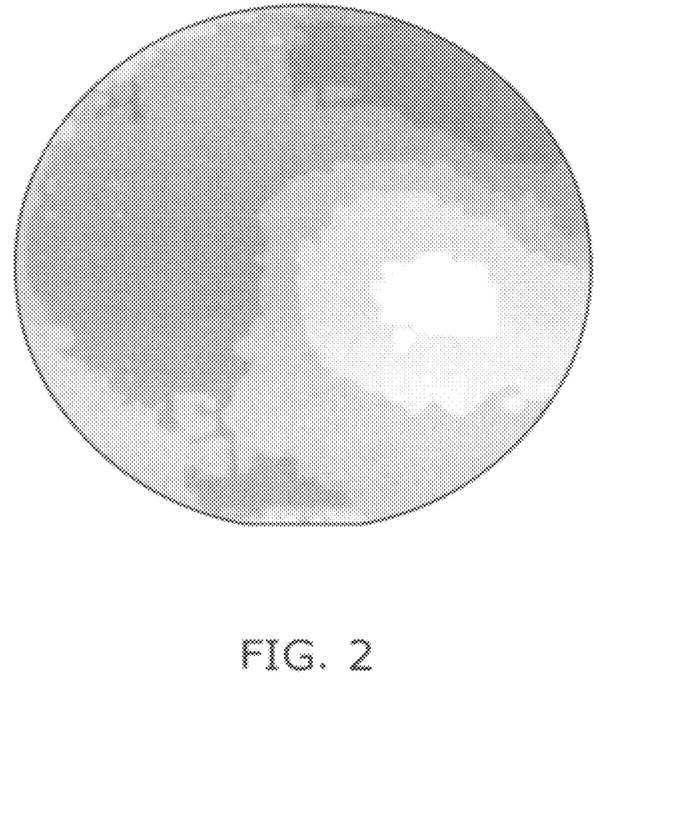
FIG. 2 is a schematic view for illustrating the distribution of the wavelength of light emitted from a plurality of light emitting sections formed on the substrate.

FIG. 2 is a schematic view for illustrating the distribution of the wavelength of light emitted from a plurality of light emitting sections formed on the substrate.

Here, the distribution of the wavelength of light emitted from a plurality of light emitting sections formed on the substrate is represented by monotone shading, with a shorter wavelength of light shaded darker, and a longer wavelength of light shaded lighter.

As shown in FIG. 2, the wavelength of light emitted from the light emitting sections may vary with the position on the substrate.

This means that variation occurs in the wavelength of light emitted from the formed light emitting sections 2.

Figure 3A:
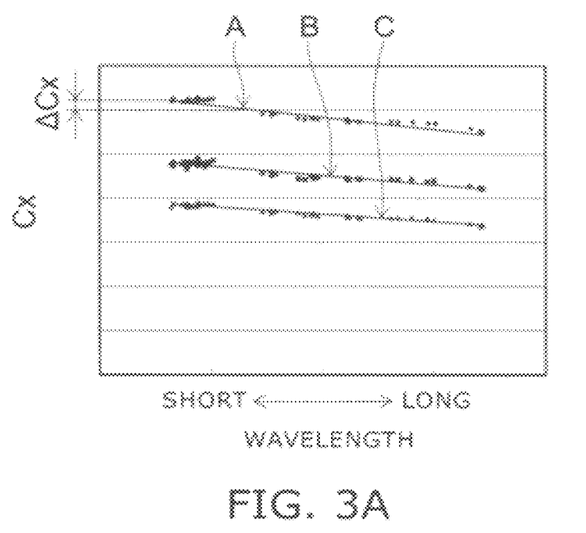
FIGS. 3A and 3B are schematic graphs for illustrating the relationship between wavelength and chromaticity.
Figure 3B:
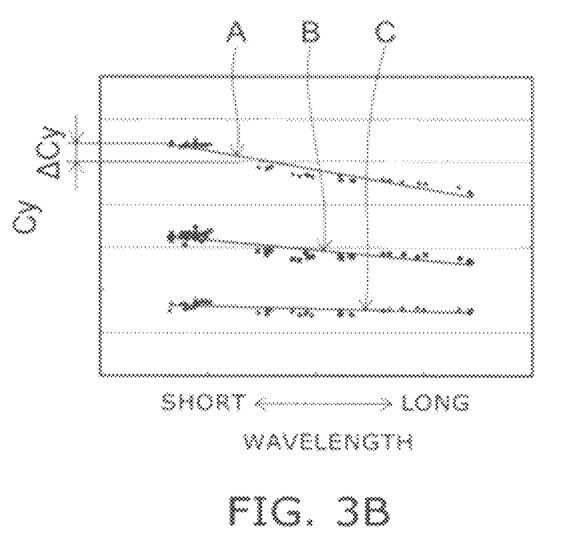

FIGS. 3A and 3B are schematic graphs for illustrating the relationship between wavelength and chromaticity.

More specifically, FIG. 3A is a schematic graph for illustrating the relationship between wavelength and the value Cx of the X-coordinate in the chromaticity diagram. FIG. 3B is a schematic graph for illustrating the relationship between wavelength and the value Cy of the Y-coordinate in the chromaticity diagram.

In FIGS. 3A and 3B, symbol A indicates the case where the thickness dimension of the wavelength conversion section is approximately 100 μm. Symbol B indicates the case where the thickness dimension of the wavelength conversion section is approximately 65 μm. Symbol C indicates the case where the thickness dimension of the wavelength conversion section is approximately 45 μm. In these cases, the proportion of the amount of phosphor included in the wavelength conversion section is fixed.

As shown in FIGS. 3A and 3B, as the wavelength becomes longer, the value Cx of the X-coordinate and the value Cy of the Y-coordinate in the chromaticity diagram are both decreased.

This means that the variation in the wavelength of light emitted from the light emitting sections 2 results in the variation of chromaticity as well.

Furthermore, as the thickness dimension of the wavelength conversion section 8 becomes thinner, the value Cx of the X-coordinate and the value Cy of the Y-coordinate in the chromaticity diagram are both decreased.

This means that the value Cx of the X-coordinate and the value Cy of the Y-coordinate in the chromaticity diagram can be decreased by decreasing the amount of phosphor included in the wavelength conversion section 8.

It is thus found that the variation of chromaticity can be suppressed by controlling the amount of phosphor included in the wavelength conversion section 8 based on the wavelength of light emitted from the light emitting sections 2.

For instance, for A, B, and C in FIGS. 3A and 3B, the amount of phosphor included in the wavelength conversion section 8 formed on the light emitting section 2 emitting light at short wavelength (left side in the figures) can be decreased to decrease the value Cx and the value Cy. This can reduce the difference from the value Cx and the value Cy in the light emitting section 2 emitting light at long wavelength (right side in the figures).

Thus, the wavelength conversion section can be configured to have a distribution of the amount of phosphor such that the amount of phosphor at the position with short wavelength of light is smaller than the amount of phosphor at the position with long wavelength of light.

In this case, as shown in FIGS. 1A and 1B, wavelength conversion sections 8a-8e with different amounts of phosphor included therein can be appropriately provided based on the wavelength of light emitted from the light emitting sections 2.

That is, the wavelength conversion section can be configured to have a distribution of the amount of phosphor such that the proportion of the amount of phosphor is specified at least for each light emitting section 2.

Furthermore, the amount of phosphor can be determined so that the chromaticity difference ΔCx between the value Cx on the short wavelength side and the value Cx on the long wavelength side is equal to or less than a recognition limit by human eye. In other words, the value Cx is set so that the chromaticity difference is not recognized by human eye. For example, the value Cx can be set to be 0.015 or less.

Furthermore, the amount of phosphor can be determined so that the chromaticity difference ΔCy between the value Cy on the short wavelength side and the value Cy on the long wavelength side is equal to or less than a recognition limit by human eye. For example, the value Cy can be set to be 0.015 or less.

By changing the amount of phosphor, the chromaticity difference ΔCx and the chromaticity difference ΔCy are both changed. Hence, the amount of phosphor can be determined so that the larger of the chromaticity difference ΔCx and the chromaticity difference ΔCy is equal to or less than a recognition limit by human eye.

In this case, the chromaticity difference ΔCx and the chromaticity difference ΔCy only need to be equal to or less than a recognition limit by human eye at least between the adjacent light emitting sections 2.

In the case where numerous light emitting sections 2 are provided, the light emitting sections 2 can be grouped into regions in each of which the chromaticity difference ΔCx and the chromaticity difference ΔCy are equal to or less than a recognition limit by human eye. The amount of phosphor can be determined for each grouped region.

In this case, based on the wavelength of light emitted from the light emitting sections 2, resins containing a phosphor at different proportions can be supplied to the major surface M1 side of the light emitting sections 2 and cured. Thus, wavelength conversion sections 8a-8e with different amounts of phosphor included therein can be formed.

Furthermore, as shown in FIG. 1B, a wall section 9 surrounding the periphery of the wavelength conversion section 8a-8e can be provided for each light emitting section 2. This can suppress mixing of the resins including different amounts of phosphor into the adjacent wavelength conversion section.

Furthermore, the wall section 9 can be configured to have the function of a reflector such that the light emitted from the light emitting section 2 is spread into the wavelength conversion section 8a-8e while emitting the light toward the front side of the semiconductor light emitting device 1a.

In this case, to facilitate reflection of the light emitted from the light emitting section 2, the reflectance of the wall section 9 can be set to e.g. 90% or more in the wavelength region of 380-720 nm.

The side surface of the wall section 9 (the surface on the wavelength conversion section side) is tapered in the direction from the light emitting section 2 side to the emission side tip. Thus, the light emitted from the light emitting section 2 can be spread into the wavelength conversion section 8a-8e, and the light can be efficiently emitted toward the front side of the semiconductor light emitting device 1a.

Examples of the material forming the wall section 9 can include polyphthalamide (PPA) resin and silicone resin. Furthermore, a reflective film (such as a metal thin film) made of a material having high light reflectance may be provided on the surface of the wall section 9.

However, the materials are not limited to those illustrated, but can be appropriately modified.

Figure 4:
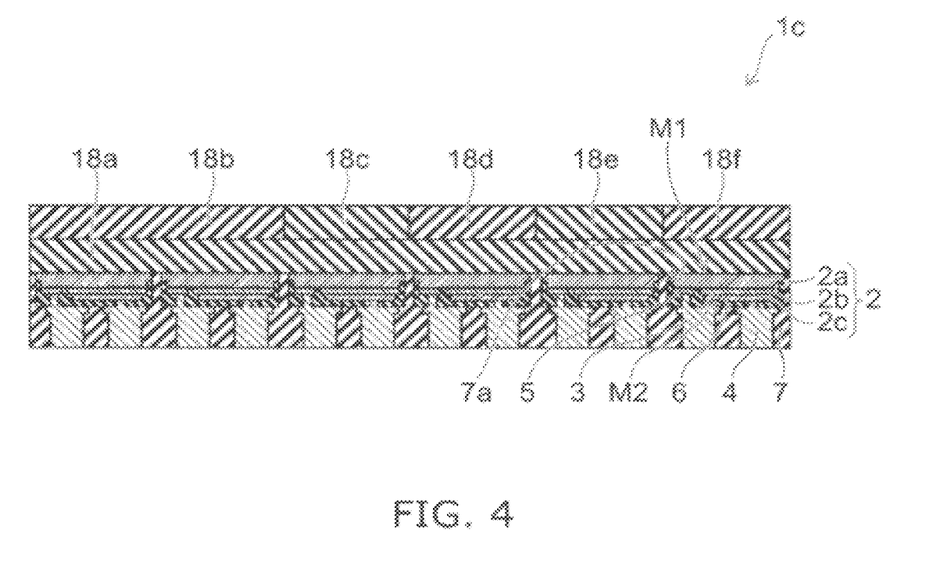
FIG. 4 is a schematic sectional view for illustrating a wavelength conversion section according an alternative embodiment.

FIG. 4 is a schematic sectional view for illustrating a wavelength conversion section according an alternative embodiment.

As shown in FIG. 4, the semiconductor light emitting device 1c includes a light emitting section 2, an electrode section 3, an electrode section 4, a junction section 5, an insulating section 6, a sealing section 7, a wavelength conversion section 18a (corresponding to an example of the first layer), and wavelength conversion sections 18b-18f (corresponding to an example of the second layer).

In the wavelength conversion section 18a, the proportion of the amount of phosphor contained is fixed. The wavelength conversion section 18a is provided on the major surface M1 side of all the light emitting sections 2.

The wavelength conversion section 18a can be formed from e.g. a resin containing a prescribed amount of phosphor.

The wavelength conversion sections 18b-18f are provided on the opposite side of the wavelength conversion section 18a from the major surface side of the light emitting sections 2.

Like the wavelength conversion sections 8a-8e described above, the wavelength conversion sections 18b-18f have a distribution of the amount of phosphor based on the wavelength of light emitted from the light emitting sections 2.

That is, on the major surface M1 side of the light emitting sections 2, the semiconductor light emitting device 1c illustrated in FIG. 4 includes a wavelength conversion section 18a with the proportion of the amount of phosphor fixed, and wavelength conversion sections 18b-18f for generating a distribution of the amount of phosphor provided so as to cover the wavelength conversion section 18a.

In this case, the phosphor included in the wavelength conversion sections 18a-18f is configured to emit light of the same color (e.g., to be the same kind of phosphor), and the amount of phosphor contained therein can be varied.

For instance, this is applicable to the case where blue light is emitted from the light emitting sections 2, and a phosphor for emitting yellow light complementary to blue is provided to obtain white light.

Thus, a wavelength conversion section 18a with the proportion of the amount of phosphor fixed can be provided on the major surface M1 side of the light emitting sections 2. Furthermore, wavelength conversion sections 8a-8e for generating a distribution of the amount of phosphor can be appropriately provided to suppress the variation of chromaticity.

Furthermore, similarly to the example illustrated in FIG. 1B, a wall section 9 surrounding the periphery of each wavelength conversion section 18a-18f can be provided between the light emitting sections 2.

According to this embodiment, similarly to the embodiment described above, the variation of chromaticity can be suppressed. Furthermore, the wavelength conversion sections 18b-18f can be appropriately provided after forming the wavelength conversion section 18a. Hence, this embodiment can be applied also to repairing the defective portion with large variation of chromaticity.

Figure 5A:
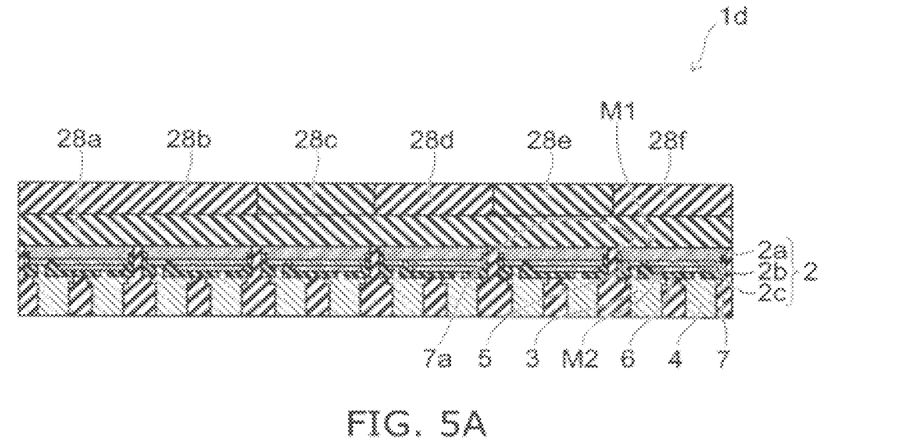
FIGS. 5A and 5B are also schematic sectional views for illustrating wavelength conversion sections according an alternative embodiment.
Figure 5B:
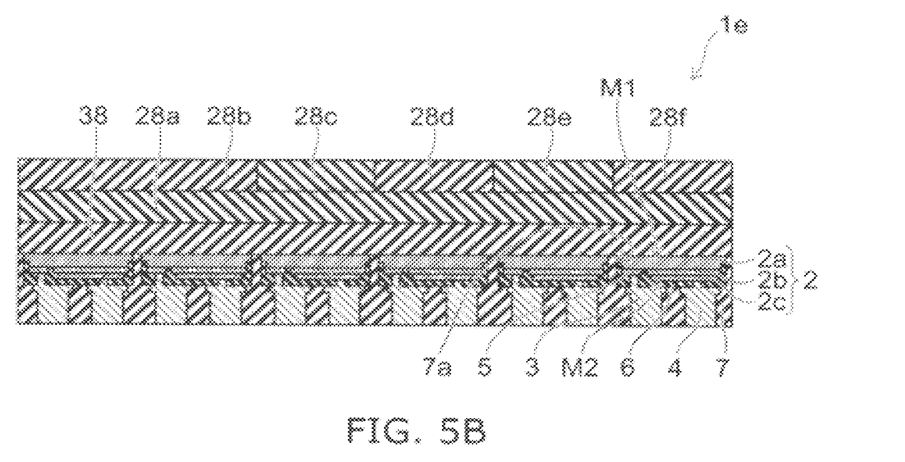

FIGS. 5A and 5B are also schematic sectional views for illustrating wavelength conversion sections according an alternative embodiment. More specifically, FIG. 5A shows the case where the wavelength conversion section has a two-layer structure. FIG. 5B shows the case where the wavelength conversion section has a three-layer structure.

As shown in FIG. 5A, the semiconductor light emitting device 1d includes a light emitting section 2, an electrode section 3, an electrode section 4, a junction section 5, an insulating section 6, a sealing section 7, and wavelength conversion sections 28a-28f.

In the example illustrated in FIG. 4, the phosphor included in the wavelength conversion sections 18a-18f is configured to emit light of the same color. In contrast, in the example illustrated in FIG. 5A, the phosphor included in the wavelength conversion section 28a and the phosphor included in the wavelength conversion sections 28b-28f are configured to emit light of different colors.

For instance, this is applicable to the case where blue light is emitted from the light emitting sections 2, the phosphor included in the wavelength conversion section 28a emits red light, and the phosphor included in the wavelength conversion sections 28b-28f emits green light to obtain white light from the blue light, the red light, and the green light.

The wavelength conversion sections 28b-28f provided so as to cover the wavelength conversion section 28a are configured to include different amounts of phosphor based on the wavelength of light emitted from the light emitting sections 2.

Furthermore, similarly to the example illustrated in FIG. 1B, a wall section 9 surrounding the periphery of each wavelength conversion section 28a-28f can be provided between the light emitting sections 2.

As shown in FIG. 5B, the semiconductor light emitting device 1e includes a light emitting section 2, an electrode section 3, an electrode section 4, a junction section 5, an insulating section 6, a sealing section 7, wavelength conversion sections 28a-28f, and a wavelength conversion section 38.

That is, in addition to the wavelength conversion sections 28a-28f illustrated in FIG. 5A, a wavelength conversion section 38 is provided between the wavelength conversion section 28a and the major surface M1 of the light emitting section 2.

For instance, this is applicable to the case where ultraviolet light is emitted from the light emitting sections 2, the phosphor included in the wavelength conversion section 28a emits red light, the phosphor included in the wavelength conversion sections 28b-28f emits green light, and the phosphor included in the wavelength conversion section 38 emits blue light to obtain white light from the blue light, the red light, and the green light.

The wavelength conversion sections 28b-28f provided so as to cover the wavelength conversion section 28a are configured to include different amounts of phosphor based on the wavelength of light emitted from the light emitting sections 2.

Furthermore, similarly to the example illustrated in FIG. 1B, a wall section 9 surrounding the periphery of each of the wavelength conversion sections 28a-28f and the wavelength conversion section 38 can be provided between the light emitting sections 2. In the examples illustrated in FIGS. 5A and 5B, the wavelength conversion sections are provided in two or three layers. However, this embodiment is not limited thereto.

For instance, the kind of phosphor and the number of layers of the wavelength conversion sections can be appropriately modified in relation to e.g. the color of light emitted from the light emitting sections 2.

According to this embodiment, similarly to the embodiments described above, the variation of chromaticity can be suppressed. Furthermore, the wavelength conversion sections 28b-28f can be appropriately provided after forming the wavelength conversion section 38 and the wavelength conversion section 28a. Hence, this embodiment can be applied also to repairing the defective portion with large variation of chromaticity. Furthermore, the kinds of phosphor can be rearranged depending on the color of light emitted from the light emitting sections 2. This can expand the range of application of this embodiment.

Figure 6:
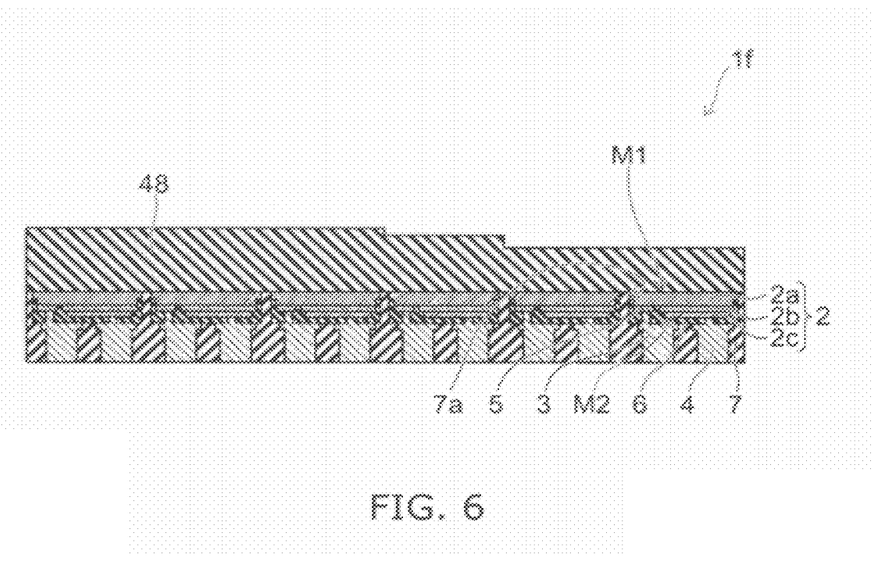
FIG. 6 is also a schematic sectional view for illustrating a wavelength conversion section according an alternative embodiment.

FIG. 6 is also a schematic sectional view for illustrating a wavelength conversion section according an alternative embodiment. As shown in FIG. 6, the semiconductor light emitting device 1f includes a light emitting section 2, an electrode section 3, an electrode section 4, a junction section 5, an insulating section 6, a sealing section 7, and a wavelength conversion section 48.

The example illustrated in FIGS. 1A and 1B relates to the case where the wavelength conversion sections 8a-8e with the amount of phosphor adjusted are provided. The example illustrated in FIGS. 4, 5A, and 5B relates to the case where the wavelength conversion sections 18b-18f, 28b-28f for adjusting the amount of phosphor included therein are provided.

In contrast, the wavelength conversion section 48 illustrated in FIG. 6 changes the amount of phosphor by changing the thickness dimension based on the wavelength of light emitted from the light emitting sections 2 to form a distribution of the amount of phosphor.

That is, the wavelength conversion section 48 has a distribution of the amount of phosphor corresponding to the change of the thickness dimension.

Such a wavelength conversion section 48 can be formed by e.g. trimming the surface of the wavelength conversion section 48 based on the wavelength of light emitted from the light emitting sections 2.

Here, the thickness dimension of the wavelength conversion section illustrated in FIGS. 1A, 1B, 4, 5A, and 5B can also be changed.

According to this embodiment, similarly to the embodiments described above, the variation of chromaticity can be suppressed. Furthermore, the amount of phosphor can be adjusted by trimming the surface of the wavelength conversion section 48 based on the wavelength of light emitted from the light emitting sections 2. Hence, this embodiment can be applied also to repairing the defective portion with large variation of chromaticity.

[Second Embodiment]

FIGS. 7A to 8D are schematic process sectional views for illustrating a method for manufacturing a semiconductor light emitting device according to a second embodiment.

Here, FIGS. 8A to 8D are schematic process sectional views subsequent to FIGS. 7A to 7E.

Figure 7A:
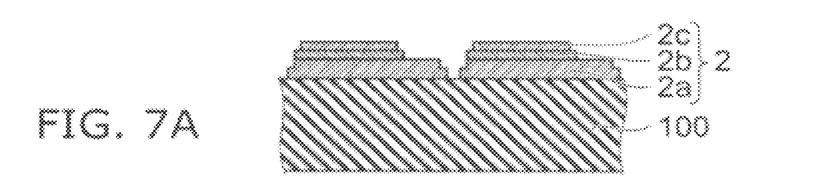

First, as shown in FIG. 7A, on a substrate 100 made of e.g. sapphire, a semiconductor section 2a, an active section 2b, and a semiconductor section 2c having a prescribed shape are formed in this order (step S1). That is, a light emitting section 2 having a prescribed shape is formed on a substrate 100 made of e.g. sapphire.

Here, film formation of these sections can be performed by using known methods such as the sputtering method and the vapor phase growth method. Examples of the vapor phase growth method can include the metal organic chemical vapor deposition (MOCVD) method, the hydride vapor phase epitaxy (HVPE) method, and the molecular beam epitaxy (MBE) method.

Then, the semiconductor section 2a, the active section 2b, and the semiconductor section 2c can be shaped by using known techniques such as lithography and etching.

Figure 7B:
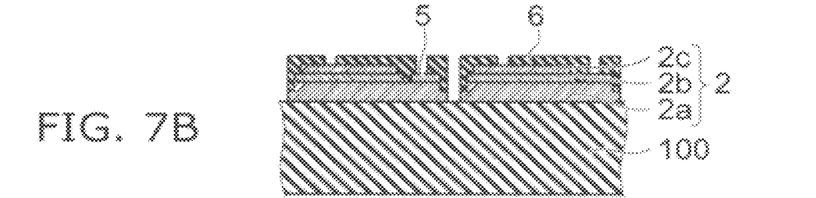

Next, as shown in FIG. 7B, a junction section 5 and an insulating section 6 are formed (step S2).

Here, the junction section 5 and the insulating section 6 can be formed by combining e.g. various physical vapor deposition (PVD) methods such as vacuum evaporation and sputtering and various chemical vapor deposition (CVD) methods with e.g. lithography and etching techniques.

Figure 7C:
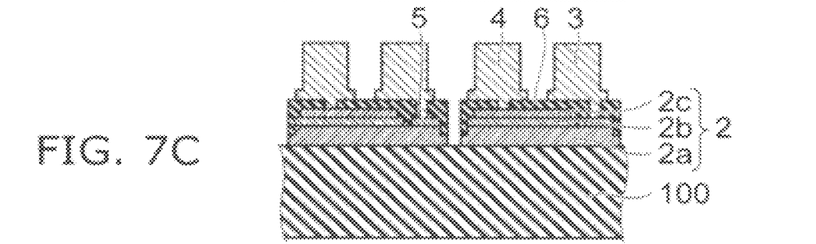

Next, as shown in FIG. 7C, an electrode section 3 and an electrode section 4 are formed (step S3).

Here, the electrode section 3 and the electrode section 4 can be formed by combining e.g. various physical vapor deposition methods such as vacuum evaporation and sputtering and various chemical vapor deposition methods with e.g. lithography and etching techniques.

Figure 7D:
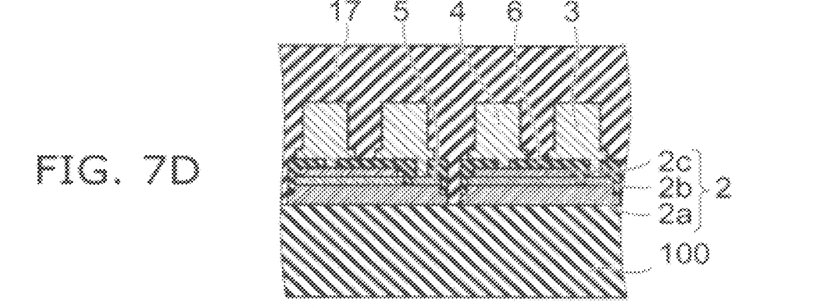

Next, as shown in FIG. 7D, a layer 17 constituting a sealing section 7 is formed (step S4). Here, the layer 17 constituting the sealing section 7 can be formed by combining e.g. various physical vapor deposition methods such as vacuum evaporation and sputtering and various chemical vapor deposition methods with e.g. lithography and etching techniques.

Figure 7E:
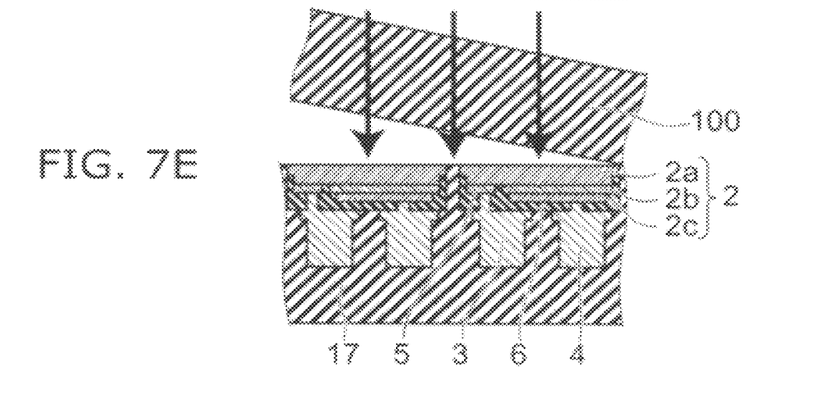

Next, as shown in FIG. 7E, the stacked body thus formed is peeled from the substrate 100 (step S5).

Here, the stacked body can be peeled from the substrate 100 by e.g. the laser lift-off method.

Here, FIG. 7E shows the case of peeling the stacked body in the reversed state.

Figure 8A:
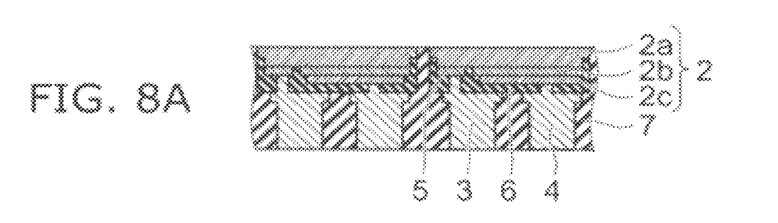

Next, as shown in FIG. 8A, the surface of the layer 17 is polished, for instance, to expose the end portion of the electrode section 3 and the electrode section 4 (step S6).

At this time, the sealing section 7 is formed.

Next, the wavelength of light emitted from the light emitting sections 2 is measured for each light emitting section 2 (step S7).

Next, the distribution of the amount of phosphor is determined based on the measured wavelength of light (step S8).

Here, as illustrated in FIGS. 2, 3A, and 3B, the correlation and the like among the wavelength of light, the amount of phosphor, and the variation of chromaticity can be previously determined by e.g. experiments and simulations. Based on this correlation, the distribution of the amount of phosphor can be determined.

Then, wavelength conversion sections are formed based on the determined distribution of the amount of phosphor (step S9).

Figure 8B:
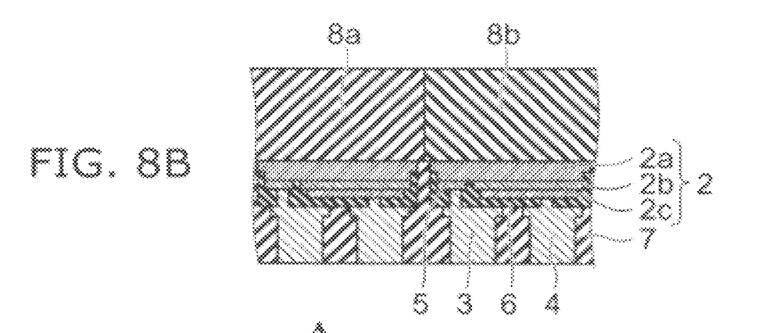

For instance, in the case of forming the wavelength conversion sections illustrated in FIGS. 1A and 1B, as shown in FIG. 8B, wavelength conversion sections 8a, 8b and the like including the determined amount of phosphor are separately formed.

Figure 8C:
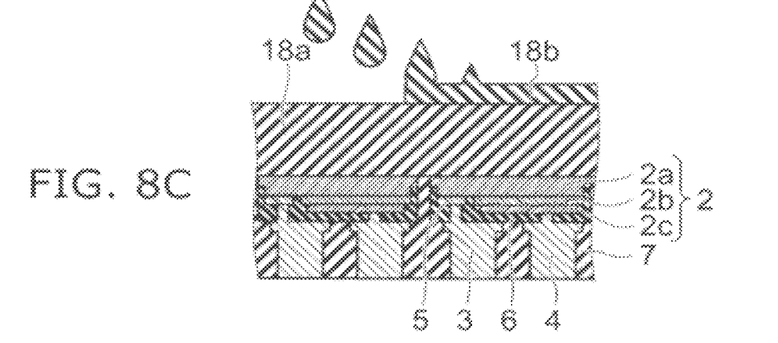

In the case of forming the wavelength conversion sections illustrated in FIGS. 4, 5A, and 5B, as shown in FIG. 8C, a wavelength conversion section 18a is formed on the major surface M1 side of all the light emitting sections 2. Then, the wavelength conversion section 18b and the like are separately formed based on the determined amount of phosphor.

That is, on one major surface M1 side of the light emitting sections 2, wavelength conversion sections are separately formed by applying a resin mixed with phosphor based on the determined distribution of the amount of phosphor.

Figure 8D:
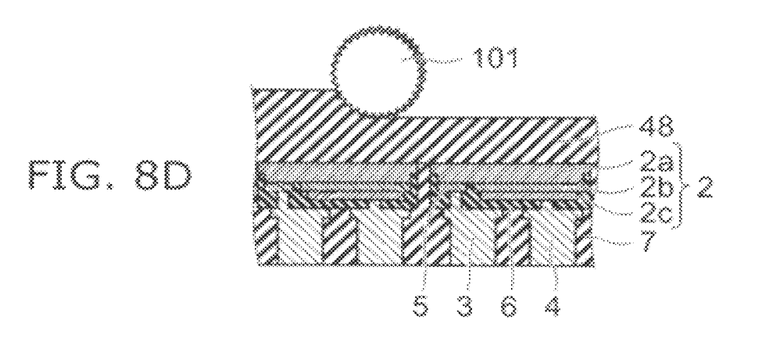

For instance, in the case of forming the wavelength conversion sections illustrated in FIG. 6, as shown in FIG. 8D, for instance, a wavelength conversion section 48 is formed on the major surface M1 side of all the light emitting sections 2. Then, the thickness dimension of the wavelength conversion section 48 is changed based on the determined amount of phosphor.

That is, on one major surface M1 side of the light emitting sections 2, a wavelength conversion section is formed by applying a resin mixed with phosphor. Then, the thickness dimension of the wavelength conversion section is changed based on the determined distribution of the amount of phosphor.

In the case of forming a wavelength conversion section on the major surface M1 side of all the light emitting sections 2, for instance, application methods such as the squeegee printing method, the compression molding method, the imprint method, the dispense method, the ink jet method, and the aerosol method can be used.

In the case of separately forming wavelength conversion sections, application methods such as the dispense method, the ink jet method, and the aerosol method can be used.

In the case of changing the thickness dimension of the wavelength conversion section, for instance, as shown in FIG. 8D, polishing with a grindstone 101 can be used.

In the case of providing the wall section 9 illustrated in FIG. 1B, the wall section 9 can be formed before forming the wavelength conversion section.

In this case, the wall section 9 can be formed by combining e.g. various physical vapor deposition methods such as vacuum evaporation and sputtering and various chemical vapor deposition methods with e.g. lithography and etching techniques.

After forming the wavelength conversion section, the variation of chromaticity in each light emitting section 2 can be measured to repair the defective portion with large variation of chromaticity.

The repair of the defective portion can be performed by e.g. separately applying a resin mixed with phosphor, or thinning the thickness dimension of the wavelength conversion section.

Furthermore, a solder bump and the like can be formed as necessary on the end portion of the electrode section 3 and the electrode section 4.

Next, division is performed as necessary.

Here, by singulation, that is by cutting a wafer and dividing it into a plurality of pieces, a semiconductor light emitting device can be configured to include one light emitting section 2. Alternatively, a semiconductor light emitting device can be configured to include a plurality of light emitting sections.

Here, the division can be performed by using e.g. the blade dicing method.

The method for manufacturing a semiconductor light emitting device according to this embodiment can easily manufacture a semiconductor light emitting device with the variation of chromaticity suppressed.

In the examples illustrated above, the semiconductor light emitting device is a multi-chip semiconductor light emitting device including a plurality of light emitting sections. However, the embodiments are also applicable to a semiconductor light emitting device including one light emitting section. For instance, the in-plane distribution in the light emission characteristics of the light emitting section 2 may result in the variation of chromaticity between the central portion and the peripheral portion of the light emitting section 2. Also in such cases, the variation of chromaticity can be suppressed by adjusting the distribution of the amount of phosphor based on the wavelength of light.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the shape, dimension, material, arrangement, number and the like of the components included in e.g. the semiconductor light emitting device 1 and the semiconductor light emitting devices 1a-1f are not limited to those illustrated, but can be appropriately modified.

What is claimed is:

1. A method for manufacturing a multi-chip semiconductor light emitting device including a plurality of light emitting sections configured to emit light and the plurality of light emitting sections being close to each other, and a wavelength conversion section provided integrally on one major surface side of the plurality of light emitting sections and containing a phosphor at a predetermined ratio of amount of the phosphor, the method comprising:

forming a stacked body including a substrate, the light emitting sections formed on the substrate, electrode sections formed on each of the light emitting sections and a sealing layer formed between the electrode sections;

removing the substrate from the light emitting sections while the light emitting sections being supported by a supporting structure including the electrode sections and the sealing layer;

measuring wavelength of the light emitted from each of the light emitting sections;

determining a distribution of amount of the phosphor based on a distribution of the measured wavelength of the light emitted from the light emitting sections;

forming an integral layer having a resin mixed with the phosphor on the one major surface side of each of the light emitting sections; and forming the wavelength conversion section by trimming a surface of the integral layer based on the determined distribution of the amount of the phosphor, the wavelength conversion section having the distribution of the amount of the phosphor by changing thickness dimension of the integral layer, thickness of the wavelength conversion section at the position of the light emitting section for emitting a short wavelength light being shorter than the thickness of the wavelength conversion section at the position of the light emitting section for emitting long wavelength light, the wavelength conversion section having at least one stepped portion, and surface of the stepped portion being flat, wherein the distribution of amount of the phosphor is determined so that a variation of chromaticity of the lights emitted through the wavelength conversion section is suppressed.

2. The method according to claim 1, wherein the determining a distribution of amount of the phosphor based on the measured wavelength of the light includes forming a distribution of the amount of the phosphor such that chromaticity difference ΔCx is equal to or less than 0.015.

3. The method according to claim 1, wherein
the determining a distribution of amount of the phosphor based on the measured wavelength of the light includes forming a distribution of the amount of the phosphor such that chromaticity difference ΔCx is equal to or less than 0.015 at least between adjacent ones of the light emitting sections.

4. A method for manufacturing a multi-chip semiconductor light emitting device including a plurality of light emitting sections configured to emit light and the plurality of light emitting sections being close to each other, and a wavelength conversion section provided integrally on one major surface side of the plurality of light emitting sections and containing a phosphor at a predetermined ratio of amount of the phosphor, the method comprising:
    removing a substrate from a stacked body including the substrate, the light emitting sections formed on the substrate, electrode sections formed on each of the light emitting sections and a sealing layer formed between the electrode sections, the substrate being removed while the light emitting sections being supported by a supporting structure including the electrode sections and the sealing layer;
    measuring wavelength of the light emitted from each of the light emitting sections;
    forming an integral layer having a resin mixed with the phosphor on the one major surface side of the light emitting sections; and
    forming the wavelength conversion section by trimming a surface of the integral layer based on a distribution of an amount of the phosphor, the distribution being determined based on a distribution of the measured wavelength of the light emitted from the light emitting sections, the wavelength conversion section having the distribution of the amount of the phosphor by changing thickness dimension of the integral layer, thickness of the wavelength conversion section at the position of the light emitting section for emitting a short wavelength light being shorter than the thickness of the wavelength conversion section at the position of the light emitting section for emitting long wavelength light, the wavelength conversion section having at least one stepped portion, and a surface of the stepped portion being flat,
    wherein the distribution of amount of the phosphor is determined so that a variation of chromaticity of the lights emitted through the wavelength conversion section is suppressed.

5. The method according to claim 4, wherein the determining a distribution of amount of the phosphor based on the measured wavelength of the light includes forming a distribution of the amount of the phosphor such that chromaticity difference ΔCx is equal to or less than 0.015.

* * * * *